United States Patent
Pangrle et al.

(10) Patent No.: US 6,472,336 B1
(45) Date of Patent: Oct. 29, 2002

(54) FORMING AN ENCAPSULATING LAYER AFTER DEPOSITION OF A DIELECTRIC COMPRISED OF CORROSIVE MATERIAL

(75) Inventors: Suzette K. Pangrle, Cupertino, CA (US); Minh Van Ngo, Fremont, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/511,585

(22) Filed: Feb. 23, 2000

(51) Int. Cl.$^7$ .............................................. H01L 21/31
(52) U.S. Cl. ...................................... 438/784; 257/632
(58) Field of Search ................................ 438/784, 787, 438/788, 792; 257/632, 646, 787, 788

(56) References Cited

U.S. PATENT DOCUMENTS

| | | | |
|---|---|---|---|
| 5,876,798 A | * 3/1999 | Vassiliev | 437/255.3 |
| 5,937,323 A | * 8/1999 | Orczyk et al. | 438/624 |
| 6,150,010 A | * 11/2000 | Eissa | 428/201 |
| 6,153,512 A | * 11/2000 | Chang et al. | 438/624 |
| 6,166,427 A | * 12/2000 | Huang et al. | 257/635 |
| 6,274,933 B1 | * 8/2001 | Abdelgadir et al. | 257/758 |

* cited by examiner

Primary Examiner—David Nelms
Assistant Examiner—Quoc D Hoang
(74) Attorney, Agent, or Firm—Monica H. Choi

(57) ABSTRACT

Insulating material is formed to surround interconnect structures of an integrated circuit. A first semiconductor wafer is placed in a reaction chamber for forming the insulating material surrounding the interconnect structures of the integrated circuit on the first semiconductor wafer. A corrosive dielectric material having low dielectric constant is deposited to surround the interconnect structures, and the corrosive dielectric material fills any gaps between the interconnect structures. Deposition of the corrosive dielectric material is performed within the reaction chamber, and the corrosive dielectric material is deposited on the reaction chamber during deposition of the corrosive dielectric material on the first semiconductor wafer. An encapsulating layer is formed over the corrosive dielectric material on the first semiconductor wafer and on the reaction chamber to prevent contact of the corrosive dielectric material to any exposed structure of a second semiconductor wafer to be subsequently placed into the reaction chamber when such an exposed structure is reactive with the corrosive dielectric material.

11 Claims, 3 Drawing Sheets

FORMING AN ENCAPSULATING LAYER AFTER DEPOSITION OF A DIELECTRIC COMPRISED OF CORROSIVE MATERIAL

TECHNICAL FIELD

The present invention relates generally to formation of interconnect during fabrication of integrated circuits, and more particularly, to formation of an encapsulating layer after deposition of a dielectric comprised of corrosive material to prevent the corrosive material from degrading structures on subsequently processed semiconductor wafers.

BACKGROUND OF THE INVENTION

A long-recognized important objective in the constant advancement of monolithic IC (Integrated Circuit) technology is the enhancement of the speed performance of integrated circuits. A common component of an integrated circuit is interconnect for coupling the various components of the integrated circuit. Referring to FIG. 1, a first interconnect structure 102 and a second interconnect structure 104 are formed on an insulating layer 106 of an integrated circuit fabricated on a semiconductor wafer 108. For example, when the semiconductor wafer 108 is comprised of silicon, the insulating layer 106 is typically comprised of silicon dioxide, and the first and second interconnect structures 102 and 104 may be aluminum metal lines.

An insulating material 110 is deposited to surround the first and second interconnect structures 102 and 104 and to fill the gaps between the interconnect structures 102 and 104. For enhancing the speed performance of the integrated circuit, the insulating material 110 surrounding the interconnect structures 102 and 104 is a dielectric material designed to have a low dielectric constant. A dielectric material with a low dielectric constant results in lower capacitance between the interconnect structures 102 and 104. Such lower capacitance results in higher speed performance of the integrated circuit and also in lower power dissipation. In addition, such lower capacitance results in lower cross-talk between the interconnect structures 102 and 104. Lower cross-talk between interconnect structures 102 and 104 is especially advantageous when the interconnect structures 102 and 104 are disposed closer together as device density continually increases.

A desired dielectric material having low dielectric constant for the insulating material 110 surrounding the interconnect structures 102 and 104 is fluorinated silicon dioxide, as known to one of ordinary skill in the art of integrated circuit fabrication. However, fluorine is corrosive for many integrated circuit structures on an semiconductor wafer. For example, fluorine is corrosive to interconnect structures comprised of aluminum and is corrosive to some types of insulating materials, as known to one of ordinary skill in the art of integrated circuit fabrication. A liner layer 112 is deposited conformally on the exposed surfaces of the interconnect structures 102 and 104 before fluorinated silicon dioxide is deposited to surround and protect the interconnect structures 102 and 104 from the corrosive fluorine.

Referring to FIG. 2, the interconnect structures 102 and 104 are initially patterned on the insulating layer 106. Referring to FIG. 3, the liner layer 112 is deposited conformally on the exposed surfaces of the interconnect structures 102 and 104. Referring to FIG. 4, fluorinated silicon dioxide is deposited to surround the interconnect structures 102 and 104 after the conformal deposition of the liner layer 112. (Elements having the same reference number in FIGS. 1, 2, 3, and 4 refer to elements having similar structure and function.)

The liner layer 112 is comprised of a dielectric material that is not corrosive to the interconnect structures 102 and 104. For example, the liner layer 112 may be comprised of silicon dioxide for example. The liner layer 112 prevents the corrosive material such as fluorine of the fluorinated silicon dioxide from making contact with the interconnect structures 102 and 104 to prevent degradation of the interconnect structures 102 and 104.

Processes for deposition of the liner layer 112 and fluorinated silicon dioxide 114 are performed in a deposition reaction chamber as known to one of ordinary skill in the art of integrated circuit fabrication. During deposition of the fluorinated silicon dioxide in such a deposition reaction chamber, fluorinated silicon dioxide is also deposited on the deposition reaction chamber. When a subsequent semiconductor wafer having exposed structures that are reactive with fluorine, such as bare interconnect structures thereon (as illustrated in FIG. 2) for example, is then placed in the deposition reaction chamber, the fluorine present in the deposition reaction chamber may degrade such structures of the subsequent semiconductor wafer.

Thus, a mechanism is desired for protecting any exposed structures of the subsequent semiconductor wafer placed into such a deposition reaction chamber when such exposed structures are reactive with fluorine.

SUMMARY OF THE INVENTION

Accordingly, in a general aspect of the present invention, a protective encapsulating layer is deposited on the prior semiconductor wafer having the corrosive fluorinated silicon dioxide and on the deposition reaction chamber to prevent contact of the corrosive fluorine with any exposed structures of the subsequent semiconductor wafer placed into the deposition reaction chamber when such exposed structures are corrosively reactive with the fluorine.

In one embodiment of the present invention, insulating material is formed to surround interconnect structures of an integrated circuit. A first semiconductor wafer is placed in a reaction chamber for forming the insulating material surrounding the interconnect structures of the integrated circuit on the first semiconductor wafer. A dielectric material is deposited to surround the interconnect structures and to fill any gaps between the interconnect structures. The dielectric material surrounding the interconnect structures is comprised of a corrosive material that degrades integrated circuit structures. Deposition of the corrosive dielectric material surrounding the interconnect structures is performed within the reaction chamber, and the corrosive dielectric material is deposited on the reaction chamber during deposition on the first semiconductor wafer. An encapsulating layer is formed over the corrosive dielectric material on the first semiconductor wafer and on the reaction chamber to prevent contact of the corrosive material to any exposed structures of a second semiconductor wafer to be subsequently placed into the reaction chamber when such exposed structures are reactive with the corrosive dielectric material.

The present invention may be used to particular advantage when the corrosive dielectric material is comprised of fluorinated silicon dioxide and when the encapsulating layer is comprised of unfluorinated silicon dioxide. When the interconnect structures are comprised of aluminum, a liner layer of unfluorinated silicon dioxide may be conformally deposited on such interconnect structures before deposition of the corrosive dielectric material.

These and other features and advantages of the present invention will be better understood by considering the

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, and 7 refer to elements having similar structure and function.

DETAILED DESCRIPTION

Figure 5:
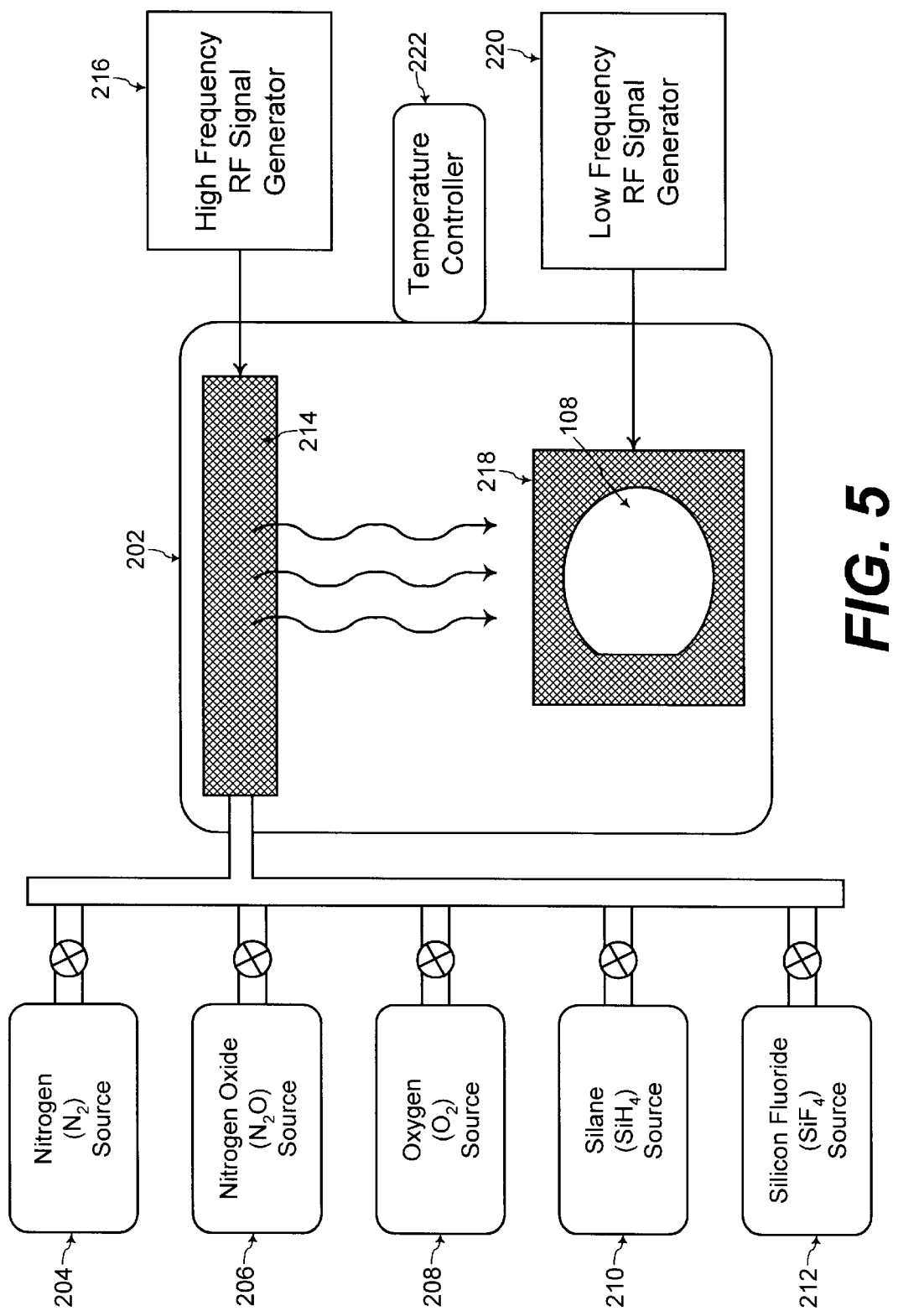
FIG. 5 shows components of a reaction chamber for forming the insulating material to surround interconnect structures of an integrated circuit, according to an embodiment of the present invention.

Referring to FIG. 5, the semiconductor wafer 108 is placed into a reaction chamber 202 for formation of the insulating structure surrounding the interconnect structures on the semiconductor wafer 108. The reaction chamber 202 is for a PECVD (plasma enhanced chemical vapor deposition) process according to one example embodiment of the present invention. However, the present invention may be practiced with other types of chemical vapor deposition processes such as a HDPCVD (high density plasma chemical vapor deposition) process, as would be apparent to one of ordinary skill in the art of integrated circuit fabrication from the description herein.

A nitrogen ($N_2$) source 204, a nitrogen oxide ($N_2O$) source 206, an oxygen ($O_2$) source 208, a silane ($SiH_4$) source 210, and a silicon fluoride ($SiF_4$) source 212 are coupled to the reaction chamber 202. Nitrogen ($N_2$) gas is controlled to flow from the nitrogen ($N_2$) source 204 into the reaction chamber 202. Nitrogen oxide ($N_2O$) gas is controlled to flow from the nitrogen oxide ($N_2O$) source 206 into the reaction chamber 202. Oxygen ($O_2$) gas is controlled to flow from the oxygen ($O_2$) source 208 into the reaction chamber 202. Silane ($SiH_4$) gas is controlled to flow from the silane ($SiH_4$) source 210 into the reaction chamber 202. Silicon fluoride ($SiF_4$) gas is controlled to flow from the silicon fluoride ($SiF_4$) source 212 into the reaction chamber 202.

The reaction chamber 202 further includes a showerhead 214 which is fed with nitrogen ($N_2$) gas from the nitrogen ($N_2$) source 204, the nitrogen oxide ($N_2O$) gas from the nitrogen oxide ($N_2O$) source 206, oxygen ($O_2$) gas from the oxygen ($O_2$) source 208, silane ($SiH_4$) gas from the silane ($SiH_4$) source 210, and silicon fluoride ($SiF_4$) gas from the silicon fluoride ($SiF_4$) source 212. In addition, a high frequency RF signal generator 216 is operatively coupled to the showerhead 214. A high frequency RF signal from the high frequency RF signal generator 216 is applied to the showerhead 214 for producing the plasma in a PECVD (plasma enhanced chemical vapor deposition) process of an example embodiment of the present invention.

The reaction chamber 202 further includes a heating block 218 which holds the semiconductor wafer 108. The heating block 218 is heated up to a predetermined temperature to maintain the semiconductor wafer 108 at the predetermined temperature. In addition, a low frequency RF signal generator 220 is operatively coupled to the heating block 218. A low frequency RF signal from the low frequency RF signal generator 220 is applied to the heating block 218 holding the semiconductor wafer 108 such that a voltage bias appears on the heating block 218. Such voltage bias on the heating block 218 attracts the plasma generated by the showerhead 214 toward the semiconductor wafer 108. Thus, plasma from the showerhead 214 is present near the semiconductor wafer 108. Furthermore, the reaction chamber 202 of an embodiment of the present invention further includes a chamber temperature controller 222.

Figure 1:
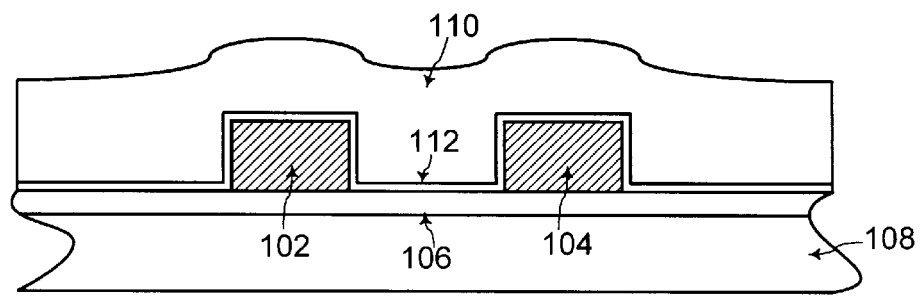
FIG. 1 shows a cross-sectional view of interconnect structures surrounded by insulating material, according to the prior art.
Figure 2:
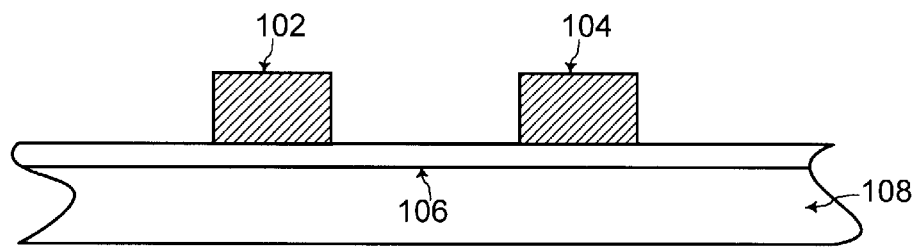
FIG. 2 shows a cross-sectional view of bare interconnect structures patterned on an insulating layer of a semiconductor wafer.
Figure 3:
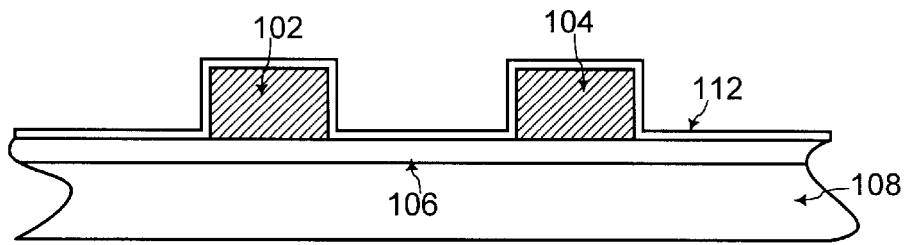
FIG. 3 shows a cross-sectional view of the interconnect structures of FIG. 2 with a liner layer formed on the exposed surfaces of the interconnect structures.

Referring to FIG. 5, for formation of the insulating structure surrounding the interconnect structures on the semiconductor wafer 108 according to one embodiment of the present invention, the semiconductor wafer 108 is placed on the heating block 218 in the reaction chamber 202. Referring to FIGS. 3 and 5, the liner layer 112 is conformally deposited on any exposed surfaces of the interconnect structures 102 and 104. The liner layer 112 is comprised of a dielectric material that is not corrosive to the interconnect structures 102 and 104, which may be comprised of aluminum for example. Processes for depositing the liner layer 112 are known to one of ordinary skill in the art.

Figure 4:
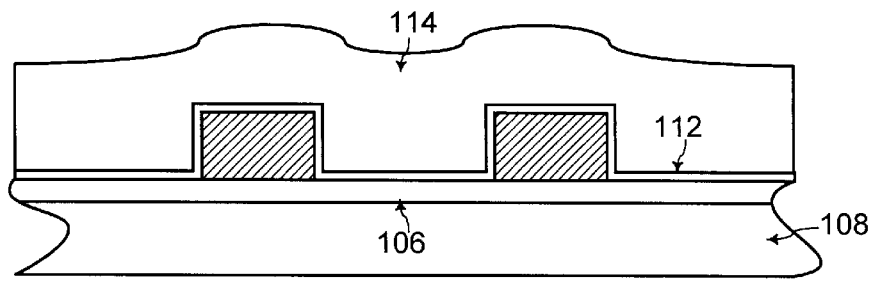
FIG. 4 shows a cross-sectional view of the interconnect structures of FIG. 3 with an insulating layer comprised of a corrosive material surrounding the interconnect structures and the liner layer.

Referring to FIGS. 4 and 5, after deposition of the liner layer 112, the insulating material 114 of a dielectric material having a low dielectric constant is deposited using a (PECVD) plasma enhanced chemical vapor deposition process according to one example embodiment of the present invention. The dielectric material 114 having a low dielectric constant is fluorinated silicon dioxide. In that case, the oxygen ($O_2$) gas is controlled to flow from the oxygen ($O_2$) source 208 into the reaction chamber 202 with a flow rate of about 100 to 300 sccm (standard cubic cm per minute), the silane ($SiH_4$) gas is controlled to flow from the silane ($SiH_4$) source 210 into the reaction chamber 202 with a flow rate of about 10 to 100 sccm (standard cubic cm per minute), and the silicon fluoride ($SiF_4$) gas is controlled to flow from the silicon fluoride ($SiF_4$) source 212 into the reaction chamber 202 with a flow rate of about 10 to 200 sccm (standard cubic cm per minute).

In addition, the heating block 218 which holds the semiconductor wafer 108 is also heated up to be about 400° C. Inert gases such as argon or helium may also be controlled to flow into the reaction chamber 202 for controlling the temperature and/or pressure within the reaction chamber 202.

With the (PECVD) plasma enhanced chemical vapor deposition process according to one example embodiment of the present invention, a high frequency RF signal is applied on the showerhead 214 from the high frequency RF signal generator 216. The high frequency RF signal applied on the showerhead 214 has a power of about 2300 Watts. Additionally, a low frequency RF signal is applied on the heating block 218 that holds the semiconductor wafer 108 during the high density plasma enhanced chemical vapor deposition process. The low frequency RF signal is generated from the low frequency RF signal generator 220 with a power of about 4200 Watts.

With the above-mentioned conditions within the reaction chamber 202, deposition of the fluorinated silicon dioxide 114 takes place on the semiconductor wafer 108 when the high frequency RF signal from the high frequency RF signal generator 216 is applied on the showerhead 214 and when the low frequency RF signal from the low frequency RF signal generator 220 is applied on the heating block 218.

The fluorinated silicon dioxide 114 is deposited to surround the interconnect structures 102 and 104 and to fill the gaps between the interconnect structures 102 and 104 on the semiconductor wafer 108. Additionally, fluorinated silicon dioxide also deposits on the walls of the reaction chamber 202 during such a deposition process within the reaction chamber 202. Fluorine comprising the fluorinated silicon dioxide is corrosive to many types of integrated circuit structures on a semiconductor wafer such as aluminum interconnect and many types of insulating material, as known to one of ordinary skill in the art of integrated circuit fabrication. The liner layer 112 prevents contact of the fluorine from the fluorinated silicon dioxide 114 with the interconnect structures 102 and 104 to prevent degradation of the interconnect structures 102 and 104.

However, fluorine present on the walls of the reaction chamber 202 may degrade any exposed structures on a subsequent semiconductor wafer to be placed into the reaction chamber 202 when such exposed structures are reactive with the corrosive fluorine. According to a general aspect of the present invention, such contact of the corrosive fluorine with such structures on the subsequent semiconductor wafer to be placed into the reaction chamber 202 is prevented by forming an encapsulating layer after deposition of the dielectric material 114 of fluorinated silicon dioxide.

Figure 6:
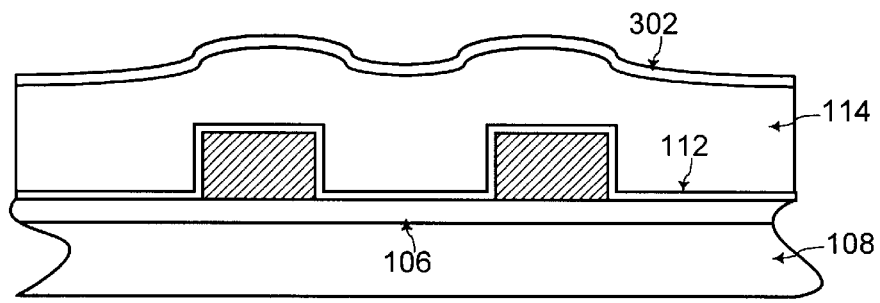
FIG. 6 shows a cross-sectional view of the interconnect structures of FIG. 4 with an encapsulating layer formed to prevent contact of the corrosive material with any exposed structures of a subsequent semiconductor wafer placed into the reaction chamber when such exposed structures are reactive with the corrosive material, according to an embodiment of the present invention.

Referring to FIGS. 5 and 6, after deposition of the dielectric material 114 of fluorinated silicon dioxide, an encapsulating layer 302 is formed over the dielectric material 114 of fluorinated silicon dioxide on the semiconductor wafer 108 and on the reaction chamber 202 to encapsulate the fluorine. In one embodiment of the present invention, the encapsulating layer 302 is unfluorinated silicon dioxide. In that case, the flow of the silicon fluoride ($SiF_4$) gas is turned off at the silicon fluoride ($SiF_4$) source 212. In addition, the oxygen ($O_2$) gas is controlled to flow from the oxygen ($O_2$) source 208 into the reaction chamber 202 with a flow rate in a range of from about 100 sccm (standard cubic cm per minute) to about 300 sccm (standard cubic cm per minute), and the silane ($SiH_4$) gas is controlled to flow from the silane ($SiH_4$) source 210 into the reaction chamber 202 with a flow rate in a range of from about 20 sccm (standard cubic cm per minute) to about 50 sccm (standard cubic cm per minute).

In addition, the heating block 218 which holds the semiconductor wafer 108 during the high density plasma enhanced chemical vapor deposition process of the present invention is also heated up to be about 400° C. Inert gases such as argon or helium may also be controlled to flow into the reaction chamber 202 for controlling the temperature and/or pressure within the reaction chamber 202.

A high frequency RF signal is applied on the showerhead 214 from the high frequency RF signal generator 216. The high frequency RF signal applied on the showerhead 214 has a power of about 1800 to 2800 Watts. Additionally, a low frequency RF signal is applied on the heating block 218 that holds the semiconductor wafer 108. The low frequency RF signal is generated from the low frequency RF signal generator 220 with a power of about 2000 to 3500 Watts.

With the above-mentioned conditions within the reaction chamber 202, deposition of the encapsulating layer 302 of unfluorinated silicon dioxide takes place on the semiconductor wafer 108 and on the walls of the reaction chamber 202 when the high frequency RF signal from the high frequency RF signal generator 216 is applied on the showerhead 214 and when the low frequency RF signal from the low frequency RF signal generator 220 is applied on the heating block 218. The time period for the deposition of the encapsulating layer 302 onto the semiconductor wafer 108 and onto the walls of the reaction chamber 202 is about 4 to 12 seconds for the deposition of about 700 Å (angstroms) of unfluorinated silicon dioxide. However, the time period for deposition of the encapsulating layer 302 may be varied for a variable thickness of the encapsulating layer 302 in the range of from about 300 Å (angstroms) to about 1200 Å (angstroms).

Figure 7:
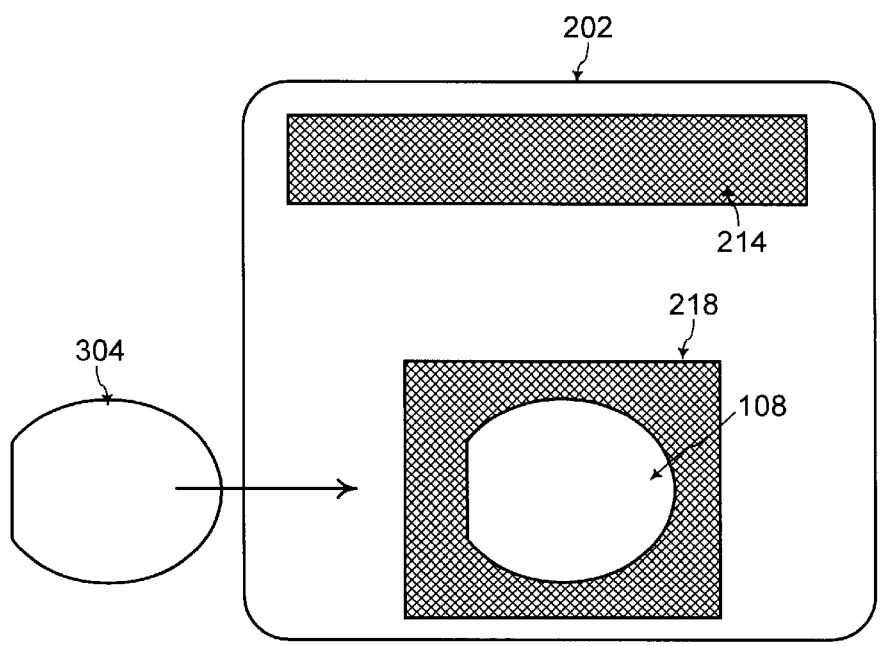
FIG. 7 illustrates the subsequent semiconductor wafer being placed into the reaction chamber after the encapsulating layer has been deposited to encapsulate the corrosive material on the reaction chamber.

Referring to FIG. 7, in this manner, with the fluorinated silicon dioxide on the semiconductor wafer 108 and on the walls of the reaction chamber 202 thus encapsulated by unfluorinated silicon dioxide, the fluorine from the fluorinated silicon dioxide is prevented from being in contact with any exposed structure of a subsequent semiconductor wafer 304 to be placed into the reaction chamber 202 when such a structure is reactive with the corrosive fluorine. For example, the interconnect structures or the liner layer of the subsequent semiconductor wafer 304 may be exposed and may be reactive with the corrosive fluorine. With such prevention of the contact of the fluorine to such structures, degradation of such structures on the subsequent semiconductor wafer 304 is avoided when the subsequent semiconductor wafer 304 is placed into the reaction chamber 202.

The foregoing is by way of example only and is not intended to be limiting. For example, the present invention may be generalized to formation of any type of encapsulating layer (aside from just the example of unfluorinated silicon dioxide) to encapsulate any type of corrosive material (aside from just the example of fluorine) comprising any type of dielectric material (aside from just the example of fluorinated silicon dioxide) surrounding the interconnect structures of an integrated circuit on a semiconductor wafer, as would be apparent to one of ordinary skill in the art of integrated circuit fabrication from the description herein. In addition, any other materials mentioned herein are by way of example only.

The present invention is limited only as defined in the following claims and equivalents thereof.

We claim:

1. A method for forming insulating material surrounding at least one interconnect structure of an integrated circuit, the method including the steps of:

A. placing a first semiconductor wafer in a reaction chamber for forming said insulating material surrounding said at least one interconnect structure of said integrated circuit using a plasma enhanced deposition process on said first semiconductor wafer;

B. depositing a corrosive dielectric material to surround said at least one interconnect structure using a first plasma enhanced deposition process within said reaction chamber, said corrosive dielectric material filling any gaps between said at least one interconnect structure;

and wherein said step B is performed within said reaction chamber, and wherein said corrosive material is deposited on said reaction chamber during said step B; and C. forming an encapsulating layer over said corrosive dielectric material using a second plasma enhanced deposition process within said reaction chamber on said first semiconductor wafer and on said reaction chamber to prevent contact of said corrosive dielectric material to any exposed structure of a second semiconductor wafer to be subsequently placed into said reaction chamber after said step C when said exposed structure is reactive with said corrosive dielectric material.

2. The method of claim 1, further including the step of:

forming a liner layer that is comprised of a material that is not corrosive to said at least one interconnect structure on said first semiconductor wafer before said step B, wherein said liner layer is deposited substantially conformal on any exposed surfaces of said at least one interconnect structure.

3. The method of claim 2, wherein said material of said liner layer is comprised of unfluorinated silicon dioxide.

4. The method of claim 1, wherein said corrosive dielectric material is an insulating material having low dielectric constant.

5. The method of claim 4, wherein said corrosive dielectric material is comprised of fluorinated silicon dioxide.

6. The method of claim 5, wherein said encapsulating layer is comprised of unfluorinated silicon dioxide.

7. The method of claim 6, wherein said encapsulating layer of unfluorinated silicon dioxide has a thickness in a range of about 300 Å (angstroms) to 1200 Å (angstroms).

8. The method of claim 7, wherein said interconnect structure is comprised of aluminum.

9. The method of claim 1, wherein said first and second plasma enhanced deposition processes are PECVD (plasma enhanced chemical vapor deposition) processes.

10. The method of claim 1, wherein said first and second plasma enhanced deposition processes are HDPCVD (high density plasma chemical vapor deposition) processes.

11. A method for forming insulating material surrounding at least one aluminum interconnect structure of an integrated circuit, the method including the steps of:

A. placing a first semiconductor wafer in a reaction chamber for forming said insulating material surrounding said at least one aluminum interconnect structure of said integrated circuit using a plasma enhanced deposition process on said first semiconductor wafer;

B. forming a liner layer of unfluorinated silicon dioxide, wherein said liner layer of unfluorinated silicon dioxide is not corrosive to said at least one aluminum interconnect structure on said first semiconductor wafer, and wherein said liner layer is deposited substantially conformal on any exposed surfaces of said at least one aluminum interconnect structure;

C. depositing fluorinated silicon dioxide having low dielectric constant to surround said liner layer on said at least one aluminum interconnect structure using a first plasma enhanced deposition process within said reaction chamber, said fluorinated silicon dioxide filling any gaps between said at least one aluminum interconnect structure;

wherein said fluorinated silicon dioxide is comprised of fluorine that degrades aluminum, and wherein said liner layer prevents contact of said fluorine to said at least one aluminum interconnect structure;

and wherein said step C is performed within said reaction chamber, and wherein said fluorine is deposited on said reaction chamber during said step C; and D. forming an encapsulating layer of unfluorinated silicon dioxide over said fluorinated silicon dioxide on said first semiconductor wafer and on said reaction chamber using a second plasma enhanced deposition process within said reaction chamber to prevent contact of fluorine to any exposed structure of a second semiconductor wafer to be subsequently placed into said reaction chamber after said step D when said exposed structure is reactive with said fluorinated silicon dioxide.

* * * * *

UNITED STATES PATENT AND TRADEMARK OFFICE
CERTIFICATE OF CORRECTION

| | | |
|---|---|---|
| PATENT NO. | : 6,472,336 B1 | |
| APPLICATION NO. | : 09/511585 | |
| DATED | : October 29, 2002 | |
| INVENTOR(S) | : Suzette K. Pangrle, Minh Van Ngo and Richard J. Huang | |

It is certified that error appears in the above-identified patent and that said Letters Patent is hereby corrected as shown below:

Claims 1 and 9 should read as follows to include the limitations as entered for the Amendment and Response dated March 4, 2002:

1. A method for forming insulating material surrounding at least one interconnect structure of an integrated circuit, the method including the steps of:

A. placing a first semiconductor wafer in a reaction chamber for forming said insulating material surrounding said at least one interconnect structure of said integrated circuit using a plasma enhanced deposition process on said first semiconductor wafer;

B. depositing a corrosive dielectric material to surround said at least one interconnect structure using a first plasma enhanced deposition process within said reaction chamber, said corrosive dielectric material filling any gaps between said at least one interconnect structure;

and wherein said step B is performed within said reaction chamber, and wherein said corrosive material is deposited on said reaction chamber during said step B; and C. forming an encapsulating layer over said corrosive dielectric material using a second plasma enhanced deposition process within said reaction chamber on said first semiconductor wafer and on said reaction chamber;

wherein said step C of forming said encapsulating layer over said corrosive dielectric material is performed within said reaction chamber by

UNITED STATES PATENT AND TRADEMARK OFFICE
CERTIFICATE OF CORRECTION

| | | |
|---|---|---|
| PATENT NO. | : 6,472,336 B1 | |
| APPLICATION NO. | : 09/511585 | |
| DATED | : October 29, 2002 | |
| INVENTOR(S) | : Suzette K. Pangrle, Minh Van Ngo and Richard J. Huang | |

It is certified that error appears in the above-identified patent and that said Letters Patent is hereby corrected as shown below:

turning off a source of a corrosive reactant of said corrosive dielectric material, without said first semiconductor wafer being removed from said reaction chamber immediately after said step B of depositing said corrosive dielectric material;

and wherein said encapsulating layer covering said corrosive dielectric material on said reaction chamber prevents contact by said corrosive dielectric material to any exposed structure of a second semiconductor wafer to be subsequently placed into said reaction chamber after said step C when said exposed structure is reactive with said corrosive dielectric material.

9. A method for forming insulating material surrounding at least one aluminum interconnect structure of an integrated circuit, the method including the steps of:

A. placing a first semiconductor wafer in a reaction chamber for forming said insulating material surrounding said at least one aluminum interconnect structure of said integrated circuit using a plasma enhanced deposition process on said first semiconductor wafer;

B. forming a liner layer of unfluorinated silicon dioxide, wherein said liner layer of unfluorinated silicon dioxide is not corrosive to said at least one aluminum interconnect structure on said first semiconductor wafer, and wherein

UNITED STATES PATENT AND TRADEMARK OFFICE
CERTIFICATE OF CORRECTION

| | |
|---|---|
| PATENT NO. | : 6,472,336 B1 |
| APPLICATION NO. | : 09/511585 |
| DATED | : October 29, 2002 |
| INVENTOR(S) | : Suzette K. Pangrle, Minh Van Ngo and Richard J. Huang |

It is certified that error appears in the above-identified patent and that said Letters Patent is hereby corrected as shown below:

said liner layer is deposited substantially conformal on any exposed surfaces of said at least one aluminum interconnect structure;

C. depositing fluorinated silicon dioxide having low dielectric constant to surround said liner layer on said at least one aluminum interconnect structure using a first plasma enhanced deposition process within said reaction chamber, said fluorinated silicon dioxide filling any gaps between said at least one aluminum interconnect structure;

wherein said fluorinated silicon dioxide is comprised of fluorine that degrades aluminum, and wherein said liner layer prevents contact of said fluorine to said at least one aluminum interconnect structure;

and wherein said step C is performed within said reaction chamber, and wherein said fluorine is deposited on said reaction chamber during said step C; and D. forming an encapsulating layer of unfluorinated silicon dioxide over said fluorinated silicon dioxide on said first semiconductor wafer and on said reaction chamber using a second plasma enhanced deposition process within said reaction chamber;

wherein said step D of forming said encapsulating layer over said fluorinated silicon dioxide is performed in-situ with said step C of forming said fluorinated silicon dioxide within said reaction chamber by turning off a source

UNITED STATES PATENT AND TRADEMARK OFFICE
CERTIFICATE OF CORRECTION

PATENT NO. : 6,472,336 B1
APPLICATION NO. : 09/511585
DATED : October 29, 2002
INVENTOR(S) : Suzette K. Pangrle, Minh Van Ngo and Richard J. Huang It is certified that error appears in the above-identified patent and that said Letters Patent is hereby corrected as shown below:

of fluorine, without said first semiconductor wafer being removed from said reaction chamber immediately after said step C of depositing said fluorinated silicon dioxide;

and wherein said encapsulating layer covering said fluorinated silicon dioxide on said reaction chamber prevents auto-doping by fluorine of any material to be deposited on any exposed interconnect structure of a second semiconductor wafer to be subsequently placed into said reaction chamber after said step D when said exposed interconnect structure is reactive with fluorine.

Signed and Sealed this

Third Day of October, 2006

JON W. DUDAS
*Director of the United States Patent and Trademark Office*